(12) United States Patent
Fredriksson

(10) Patent No.: US 7,474,721 B2
(45) Date of Patent: Jan. 6, 2009

(54) SLIDING-WINDOW BASED SIGNAL MONITORING

(75) Inventor: Jesper Fredriksson, Uppsala (SE)

(73) Assignee: Telefonaktiebolaget L M Ericsson (PUBL), Stockholm (SE)

( * ) Notice: Subject to any disclaimer, the term of this patent is extended or adjusted under 35 U.S.C. 154(b) by 1095 days.

(21) Appl. No.: 10/264,752

(22) Filed: Oct. 4, 2002

(65) Prior Publication Data
US 2004/0008763 A1  Jan. 15, 2004

(51) Int. Cl.
*H04L 7/00* (2006.01)
(52) U.S. Cl. .................................................. 375/355
(58) Field of Classification Search ......... 375/354–355, 375/359, 369, 371; 370/503, 516–517
See application file for complete search history.

(56) References Cited

U.S. PATENT DOCUMENTS

| 5,068,628 | A  | * | 11/1991 | Ghoshal ..................... 331/1 A |
| 6,269,137 | B1 | * | 7/2001  | Colella et al. ................ 375/355 |
| 6,393,071 | B1 | * | 5/2002  | Bourzeix ..................... 375/340 |
| 6,483,882 | B1 | * | 11/2002 | O'Dea ......................... 375/343 |
| 6,853,696 | B1 | * | 2/2005  | Moser et al. ................. 375/375 |
| 6,978,384 | B1 | * | 12/2005 | Milliken ...................... 709/227 |
| 7,409,031 | B1 | * | 8/2008  | Lee et al. .................... 375/376 |

FOREIGN PATENT DOCUMENTS

| GB | 2304477 A    | 8/1995  |
| JP | 2000068805 A | 8/1998  |
| WO | WO 01/78235 A1 | 10/2001 |

* cited by examiner

*Primary Examiner*—Khanh C Tran

(57) ABSTRACT

The invention is generally directed towards monitoring of a signal (m), such as a clock signal or a data signal, by sampling the signal to obtain a discrete sample representation of the signal and analyzing the sample representation. The idea according to the invention is to slide a sample window (sw) over the sampled signal and determine whether the samples currently within the window include a valid transition sequence. in the general case, the existence of a valid signal is confirmed as long as a valid transition sequence is present in at least one of a predetermined number of consecutive sample windows. in order to reduce the need for oversampling in high-frequency applications, the invention furthermore proposes a multi-phase sampling technique according to which a number of phase-shifted sample clocks (s1 to sn) are generated for the purpose of sampling the signal to be monitored. Higher-frequency oversampling is thus replaced by a higher resolution in the time domain.

30 Claims, 13 Drawing Sheets

1

SLIDING-WINDOW BASED SIGNAL MONITORING

TECHNICAL FIELD OF THE INVENTION

The present invention generally relates to signal supervision, and more particularly to a method and device for signal monitoring.

BACKGROUND OF THE INVENTION

Supervision and monitoring of signals, such as clock signals and data signals, is of vital importance and signal monitors of various types can be found in many digital electronic systems such as telecommunication systems and other digital communication systems. For example, interfaces and clock paths for a synchronous digital system must continuously be supervised in order to maintain high reliability.

Basically, a signal monitor is an arrangement for monitoring the behavior and/or status of a signal. As long as the signal behaves as normal, the signal monitor confirms the existence of a valid signal. On the other hand, if the signal behavior deviates from normal, an alarm is normally raised so that appropriate actions can be taken.

The performance evaluation of a signal monitor is normally based on detection time and reliability. In high-performance applications, it is extremely important that the monitor has a fast detection speed so that a signal failure can be detected as soon as possible. High reliability is also essential and it is normally required that the monitor can handle different metastability situations.

Conventional signal monitors are often specialized application-dependent circuit solutions that require an intimate knowledge of the particular systems in which the monitors are applied. This generally means that the signal monitors are customized for signals with certain characteristics, thus making it difficult to adapt the signal monitors to system or application changes that imply supervision of signals with other characteristics.

General detection mechanisms that are capable of handling different types of signals under various conditions are normally very complex and require extensive data processing. Existing general detection mechanisms have worked quite well for monitoring of signals of low and moderate frequency. In high-frequency applications, however, the detection time latency is generally far too high to be acceptable. In many applications, the time from the actual signal failure until the alarm is activated may be several clock cycles. For high-frequency signals, there is simply not enough time for a complex detection mechanism to detect a signal failure in just a few clock cycles. Naturally, it would be beneficial if the reaction time was less than one cycle and close to ideal pulse width detection, even for high-performance and high-frequency applications.

In high-frequency applications, the monitored signal generally has to be sampled by a sample clock of much higher frequency, so-called oversampling. However, when the frequency of the monitored signal reaches higher and higher levels, it may not be possible to generate a high-frequency sample clock for oversampling purposes, at least not to a reasonable cost.

Therefore, most general loss detectors or signal monitors of today operate in a fairly moderate frequency range where oversampling and complex decision state machines are still options.

RELATED TECHNIQUE

U.S. Pat. No. 5,719,508, relates to a digital loss of lock detector specially designed for a phase-locked loop where the mandatory phase relation between the locked signal and the reference signal at phase lock is 90°. The loss detector includes a number of latches, which are utilized to provide error signals for a number of possible erroneous relations between the locked signal and the reference signal.

U.S. Pat. No. 4,852,124, relates to a clock signal extractor which is based on a shift register, a transition detector and a frequency divider for deriving the extracted clock signal. A bipolar input signal is sampled into the shift register by a sampling signal having a frequency which is a multiple of the frequency of the input signal. The first outputs of the shift register are combined in the transition detector, which detects the presence or absence of a single transition from 0, to 1, and generates a corresponding transition detection signal. A correction logic circuit in the frequency divider compares the logic state of the frequency divider with the transition detection signal, and commands, based on the phase error thus detected, a phase correction of the extracted clock signal.

U.S. Pat. No. 5,926,047, relates to a loss-of-signal detector specially designed for a delay-locked loop (DLL) of the type which produces a plurality of output signals in response to a clock signal. The loss detector comprises a first monitor and a second monitor. The first monitor receives a first output signal from the DLL, and the second monitor receives a second output signal from the DLL, each monitor being clocked by the clock signal and the inverse of the clock signal. The first output signal and the second output signal has a predetermined phase relation which prevents a racing condition from developing at the monitors. The output signals of the monitors are processed by a number of logic gates in order to generate an alarm when the first output signal of the DLL ceases to transition at the frequency of the clock signal.

U.S. Pat. No. 5,138,636, discloses a signal loss detection circuit for a digital signal receiver of the type that includes a clock recovery circuit, which reconstitutes the received clock. A loss of signal is manifested by an absence of pulses in the reconstituted clock. The circuit for detecting loss or recovery of the received signal comprises a counter for counting pulses of the reconstituted clock lying within a count window. If the counter reaches a predetermined count state during a count window, signal recovery is indicated. Otherwise, signal loss is indicated.

SUMMARY OF THE INVENTION

The present invention overcomes these and other drawbacks of the prior art arrangements.

It is a general object of the present invention to provide a general and robust signal monitoring mechanism.

In particular, it is desirable to provide a general monitoring mechanism that is flexibly adaptable to a broad range of different applications, where the characteristics of the monitored signal may vary from application to application.

In addition, optimized high-performance realizations of the monitoring mechanism should only require a minimum of knowledge of the particular characteristics of the monitored signal.

It is another object of the invention to provide a monitoring mechanism that offers a flexible degree of error correction redundancy for handling possible metastability situations.

Yet another object of the invention is to devise a monitoring mechanism that can be formed as distributed detection algorithm and parallelized so as to reduce overall complexity and detection time latency.

It is furthermore beneficial if the signal monitoring mechanism reduces the need for oversampling, thus considerably increasing the operation frequency range.

These and other objects are met by the invention as defined by the accompanying patent claims.

The invention is generally directed towards sample-based signal monitoring, where a signal is sampled to obtain a discrete sample representation that is analyzed for monitoring the status and behavior of the sampled signal.

For the purpose of monitoring a sampled signal, the general idea according to the invention is to slide a sample window over the sampled signal and determine whether the samples currently within the window are representative of a valid transition sequence. In the general case, the existence of a valid signal is confirmed as long as a valid transition sequence is present in at least one of a predetermined number of consecutive windows.

The sample window is formed of M samples, where M is an integer equal to or greater than 3. Naturally, the actual length of the sample window is dependent on the number M of samples forming the window as well as the distance between the samples. The length of the window must be longer than the valid transition sequence in order to allow detection of the sequence within the window. For pulse width detection, the window is adapted to the length of the pulse width or pause width of the signal, and for period time detection, the window is adapted to the period time of the signal. Preferably, the distance between consecutive samples in the window is smaller than the shortest of the pulse width and the pause width of the signal to ensure sufficient detector resolution for general applications.

The sliding-window technique according to the invention allows for pulse width detection down to duty cycle variations without the use of an explicit control algorithm for aligning the detection window and the reference sample clock edges to the monitored signal transitions.

Preferably, each window among said predetermined number of consecutive windows is associated with an individual sub monitoring mechanism for determining whether the samples within the current window are representative of a valid transition sequence. By arranging the sub monitoring mechanisms for parallel as well pipelined operation, fast detection of any valid transition sequence in the monitored signal is obtained.

Depending on the particular settings of the application in question, for example when the monitored signal and the sample clock signal are synchronous with a given phase relation and the sliding sample window is designed with a minimum number of samples, it may be the case that the validity of the signal is confirmed only as long as a valid transition sequence is present in each consecutive window. However, in most practical cases, where the monitored signal and the reference sample clock normally are asynchronous, the condition for confirming validity is fulfilled as long as a valid transition sequence is detected in at least one window of a whole ensemble of consecutive windows. The number of consecutive windows in the ensemble of windows generally corresponds to the number M of samples that form the sliding window.

In order to resolve metastability issues for sample clock transitions occurring in the vicinity of the transitions of an asynchronous monitored signal, additional redundant error correction is incorporated by including a larger number M of samples with shorter distance in-between, and considering samples symmetrically around any indefinite states. In this way, detection of all edge transitions in the monitored signal is secured. By controlling the number M of samples in the sliding window, a flexible degree of error correction can be incorporated. Higher order corrections naturally require a larger number M of window samples than lower order corrections.

The actual number M of samples in the window is highly dependent on the particular application and may range from M being equal to 3, in cases where the monitored signal and the sample clock signal are synchronous and there is a well-defined phase relation between the two signals, to M being equal to or greater than 6, for asynchronous signals with large frequency and duty cycle deviations and poor jitter characteristics.

The invention thus offers a flexibly adaptable monitoring mechanism, which by simply adjusting the number M of samples in the sliding window and the distance between consecutive samples, can be adapted to handle various applications as well as possible metastability situations occurring for asynchronous signals.

In order to reduce the need for oversampling in high-frequency applications, the invention furthermore proposes a multi-phase sampling technique according to which a number of phase-shifted sample clocks of the same frequency are generated for the purpose of sampling the signal to be monitored. Various delay elements may be used to create the phase-shifted sample clocks without using a high frequency clock that otherwise would be introduced with oversampling. Higher-frequency oversampling is thus replaced by a higher resolution in the time domain.

In a further refinement of the multi-phase sampling technique, there is no need for a separate set of sample clocks, but instead the phase-shifted sample clocks are synthesized directly from the monitored clock by delay elements.

The invention offers the following advantages:

A general and flexibly adaptable monitoring mechanism;

Fast detection speed;

No need for complex alignment algorithms;

User controlled and scalable accuracy and detector resolution;

A flexible degree of error correction for metastability situations;

Reduced need for oversampling with high-frequency sample clocks;

Improved operation frequency range;

Parallelism; and

Self-monitoring.

Other advantages offered by the present invention will be appreciated upon reading of the below description of the embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION OF EMBODIMENTS OF THE INVENTION

Figure 1:
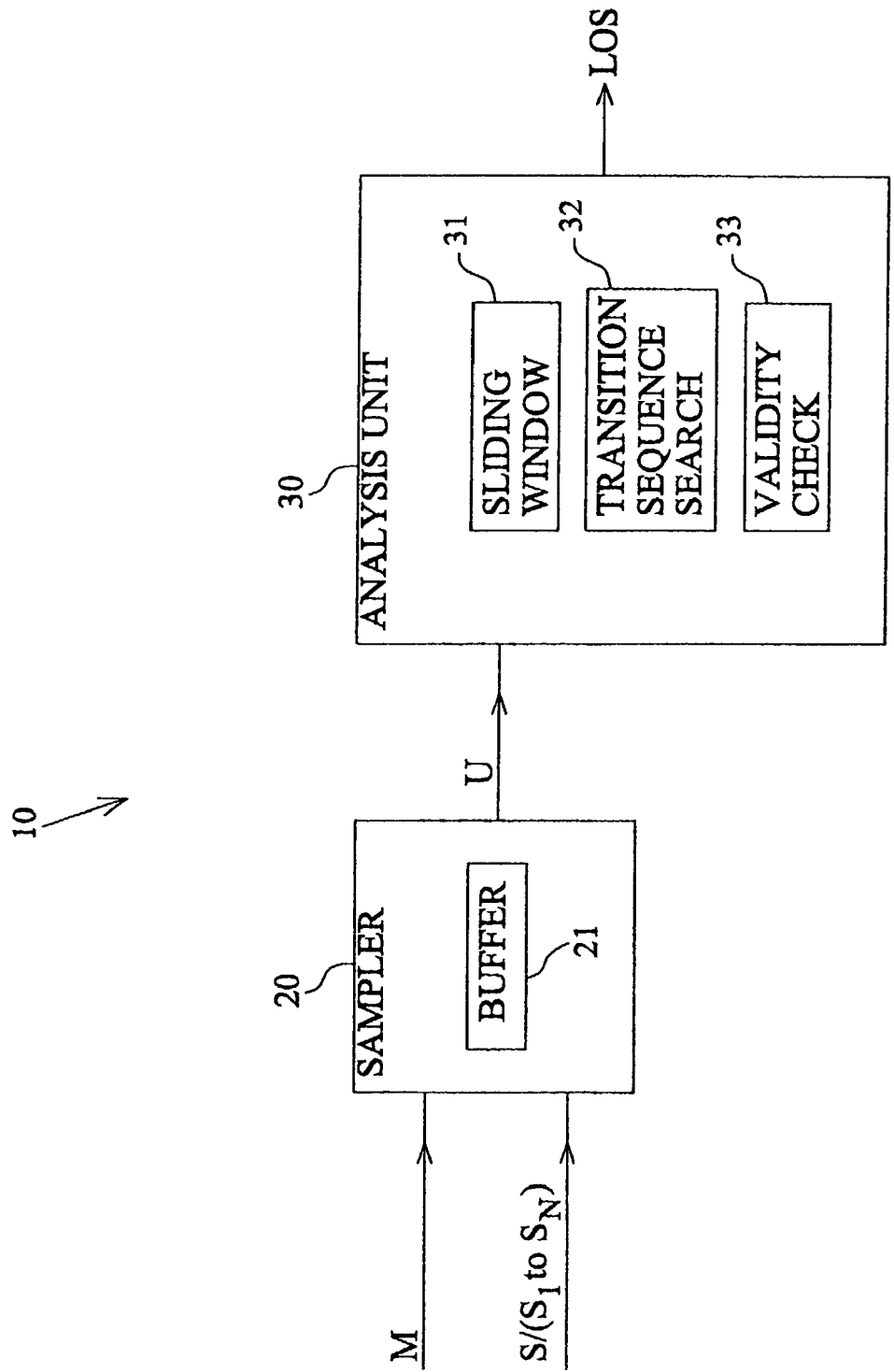
FIG. 1 is schematic block diagram of a signal monitor/loss detector according to a basic embodiment of the invention.

Throughout the drawings, the same reference characters will be used for corresponding or similar elements.

The general idea according to the invention is to monitor a sampled signal by step-wise sliding a window of a predetermined number M of samples over the sampled signal, and determining whether the samples currently in the window include a valid transition sequence. In general, the existence of a valid signal is confirmed as long as a valid transition sequence is present in at least one of a predetermined number of consecutive windows. If the validity can not be confirmed, there is generally a signal failure, for example in the form of a stuck low or stuck high fault.

As the name indicates, a transition sequence is a sequence of at least two transitions. Accordingly, a valid transition sequence may for example be a low-to-high "up" transition followed by a high-to-low "down" transition, or any other predefined sequence of transitions. Preferably, for pulse width detection, a valid transition sequence includes a first transition, and a later reverse transition in a position consistent with the expected pulse/pause width of the signal (taking into account possible variations in the monitored signal). In the case of a pulsing clock signal, the valid transition sequence may thus alternate between a first sequence defined by an up transition followed by a down transition, and a second sequence defined by a down transition followed by an up transition, where the two transition sequences are connected seamlessly to each other.

The minimum number M of samples in the sliding sample window is normally equal to 3, and such a minimum window is applicable for example in situations where the monitored signal and the sample clock are synchronous and the phase relation between the two signals is well-defined. However, for a general and possibly asynchronous signal with an arbitrary phase relation to the sample clock, the number M of samples in the sliding window must be higher in order to ensure reliable monitoring of the signal. In most practical cases, where the monitored signal is asynchronous to the sample clock, M is selected to be equal to or greater than 6, although a smaller number is possible also for the asynchronous case under certain circumstances.

For a better understanding of the invention, a schematic system overview will be given as an introduction, and then the monitoring mechanism of the invention will be described with reference to a number of simple examples of well-behaved synchronous signals with given phase relations to a sample clock signal. Later on, the inventive mechanism will be described in a more general context, in particular with reference to the preferred multi-phase sampling technique proposed by the invention.

FIG. 1 is schematic block diagram of a signal monitor/loss detector according to a basic embodiment of the invention. The signal monitor 10 basically comprises a sampler 20 and an analysis unit 30. The sampler 20 is a general circuit for sampling a signal M to be monitored into a memory buffer 21. For example, the sampler 20 may be a shift-register based circuit using a higher-frequency sample clock S for oversampling the monitored signal. Alternatively, according to a multi-phase sampling technique proposed by the invention, the monitored signal M is sampled into an array of edge-triggered memory elements by means of a number of phase-shifted sample clocks $S_1$ to $S_N$. For the time being, it is however sufficient to consider the sampler 20 as a general circuit for sampling the monitored signal so as to obtain a discrete sample representation U of the signal. The discrete sample representation U is analyzed by the analysis unit 30 in order to assess the validity of the signal, and the analysis unit 30 gives appropriate alarms (LOS) or other notifications in dependence on the outcome of the analysis. The analysis unit 30 may be implemented in hardware logic, or as software in a computer system based on for example a digital signal processor (DSP) or equivalent. The analysis unit 30 basically includes a sliding window unit 31, a transition sequence search unit 32 and a unit 33 for validity check. In a computerized implementation, the units 31 to 33 are preferably realized as software functions, procedures or modules. In a hardware implementation, the sliding window unit 31 and the search unit 32 are preferably integrated in the same hardware logic, as will be explained later on with reference to FIG. 4.

Figure 2A:
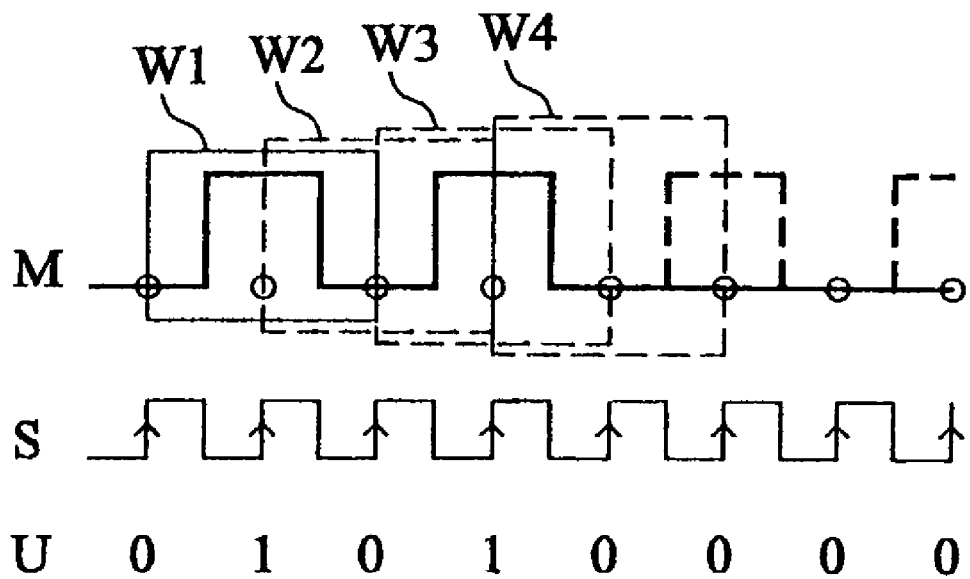
FIGS. 2A-B are schematic timing diagrams illustrating the basic principles of a sliding-window technique according to the invention.
Figure 2B:
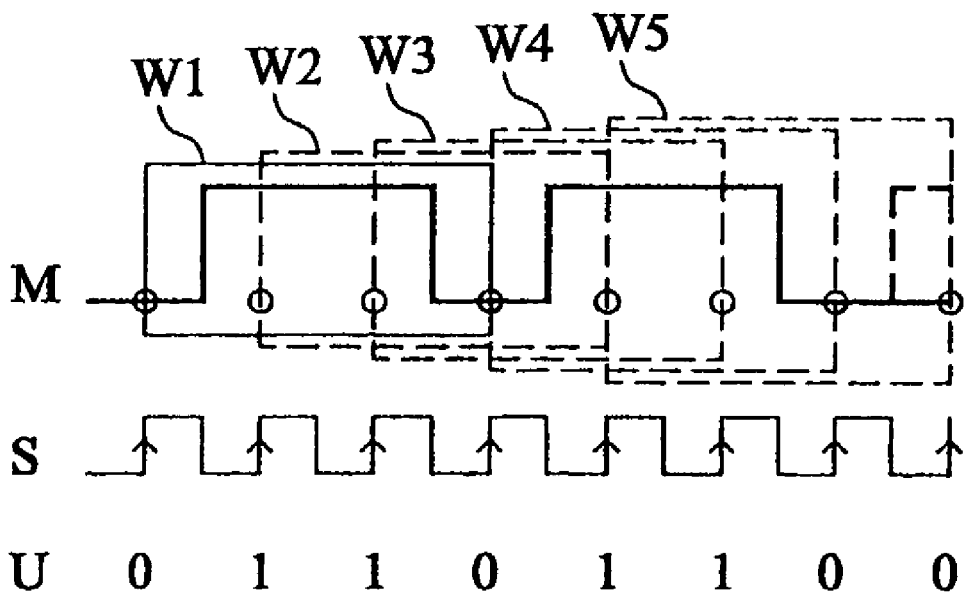

FIGS. 2A-B are schematic timing diagrams illustrating the basic principles of the sliding-window technique according to the invention.

FIG. 2A illustrates a signal M to be monitored, a sample clock signal S for sampling the signal M, and a resulting discrete sample representation U of the monitored signal. For simplicity, the monitored signal and the sample clock signal are illustrated as synchronous, the phase relation between the two signals being optimal for sampling purposes. The monitored signal M has a duty cycle of 50%, with a pulse width equal to the pause width.

For pulse width detection, a valid transition sequence is defined as a first transition followed by a reverse transition in a position consistent with the expected pulse or pause width. In order to enable pulse width detection, the sliding window has to be large enough to catch a pulse or pause. The minimum requirement on the window length in this case is three samples, and the distance between consecutive samples of the window generally has to be equal to or smaller than the pulse width in order to ensure sufficient resolution. In this example, the distance between consecutive samples is set to be equal to the pause width. This works well for the optimal phase relation between the monitored signal and the sample clock illustrated in FIG. 2A. In general, however, a distance between consecutive samples that is much smaller than the shortest of the pulse and pause width is recommended.

FIG. 2A illustrates a number of consecutive and overlapping windows W1 to W4 formed by sliding a window of the minimum of 3, samples over the sampled signal. For each consecutive window, it is determined whether the window includes a valid transition sequence. Considering window W1, it can be seen that the signal M includes a first transition as well as a second reverse transition within the window. This so-called valid transition sequence is detected in the sample representation U of the signal by comparing the logical levels of adjacent samples within the current window. A transition is normally detected as change of logical levels between adjacent samples. In window W1, a first transition is detected as a change from 0, to 1, between the first and second sample, and a second reverse transition is detected as a change from 1, to 0, between the second sample and the third sample of the sample representation U. A sufficient transition condition is generally found to be:

$$u_i \oplus u_{i+1} = 1,$$

where $u_i$, is the $i^{th}$, sample and $\oplus$ denotes an XOR operation. In window W2, a first transition is detected as a change from 1, to 0, and a second reverse transition is detected as a change from 0, to 1. A valid transition sequence is also found in window W3. In window W4, however, only a single transition from 1, to 0, is detected, and this transition can not be matched with an expected reverse transition (the actual signal is indicated by a solid line, whereas the expected normal signal is indicated by dotted lines). In the above example, which represents a special case of the general monitoring mechanism when applied to a synchronous signal, the validity of the monitored signal is confirmed only as long as a valid transition sequence is present in each consecutive window. Thus, already at the end of window W4, it can be concluded that the signal M no longer is valid. This is indeed a correct assessment, since the signal M has in fact disappeared low. Apparently, the sliding-window technique according to the invention is capable of providing fast loss detection.

FIG. 2B is similar to FIG. 2A, but now the monitored signal M is illustrated as having a different duty cycle so that the pulse width is twice the length of the pause width. The resolution is normally adapted to the shortest of the pulse width and the pause width. In the example illustrated in FIG. 2B, the distance between consecutive samples is selected to be equal to the pause width. The sliding window is naturally adapted to the longer pulse width, although it is possible to adapt the window to the shorter pause width. Anyway, with the required resolution, the number M of samples of the sliding window is selected to be equal 4. This in fact allows detection of individual pulses as well as individual pauses in the signal. By analyzing the sample representation U of the monitored signal M using the sliding window and applying the above transition condition, any valid transition sequence in the monitored signal can be securely detected. In the first window W1, a valid transition sequence is detected as a positive pulse with a transition from 0, to 1, and a subsequent transition from 1, to 0. In window W2, a valid transition sequence is detected as a pause, or a negative pulse with a transition from 1, to 0, and a subsequent transition from 0, to 1. Valid transition sequences are also found in windows W3 and W4. In window W5, however, only a single transition is detected. Since the setting of FIG. 1B requires that a valid transition sequence is present in each consecutive window for confirming the validity of the signal, it can be concluded at the end of window W5 that the monitored signal M is no longer valid.

Figure 3:
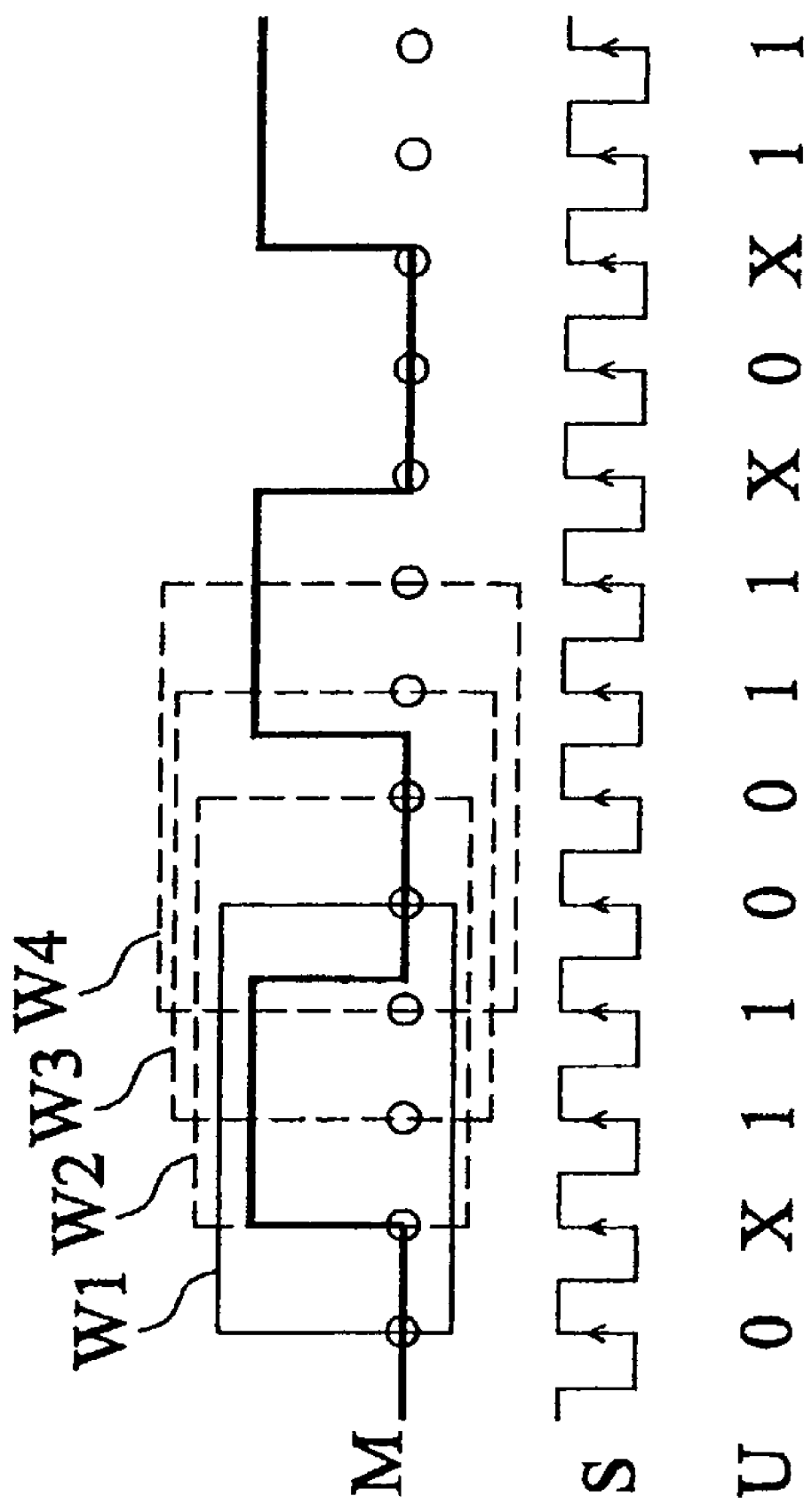
FIG. 3 is a schematic timing diagram illustrating the monitoring of an asynchronous signal by means of a detection mechanism that incorporates first order metastability correction.

FIG. 3 is a schematic timing diagram illustrating the monitoring of an asynchronous signal by means of a detection mechanism that incorporates first order metastability correction. For a signal M that is asynchronous to the sample clock signal S, metastability situations may arise when sample clock transitions occur in the vicinity of transitions of the monitored signal, a fact well-known in the art. When the monitored signal is sampled by the sampling edge of the sample clock close to a transition in the monitored signal, it may not be possible to obtain a well-defined sample value. In such a situation, it is not clear whether the monitored signal really has transitioned or not and hence the sample value may be indefinite. In FIG. 2, indefinite sample values are indicated by X in the sample representation U. The minimum distance between sample clock transitions and monitored transitions required for secure sampling may vary, depending on the particular implementation of the monitor.

Increasing the number M of samples in the sliding window so as to include a number of so-called redundant samples, allows for error correction. In case of a metastability situation affecting a certain sample, $u_i$, the samples in close proximity, primarily $u_{i-1}$, and $u_{i+1}$, are likely unaffected and hold well-defined logical values. Consequently, by not only considering adjacent samples $u_i$, and $u_{i+1}$, but also samples separated by one or more intermediate samples, preferably placed symmetrically around any sample $u_i$, under investigation, detection of all edge transitions in the monitored signal is secured. This results in the following transition conditions:

$$u_i \oplus u_{i+1} = 1; \text{ and}$$

$$u_{i-1} \oplus u_{i+1} = 1.$$

In the example illustrated in FIG. 2, the sliding window hence includes a total of 5, samples, two more samples than required for a synchronous signal. Sliding the window over the sample representation results in the formation of a series of consecutive windows, of which only windows W1 to W4 are explicitly shown. In the first window W1, it is apparent that the monitored signal M includes a pulse, but in the sample representation "0x110" of window W1, one of the samples has been trashed (X) due to metastability. However, by successively considering adjacent samples $u_i$, and $u_{i+1}$, as well as samples $u_{i-1}$, and $u_{i+1}$, separated by one sample, all edge transitions of the pulse can be detected. In window W1, the positive pulse is detected as a first transition from 0, to 1 determined from the first and third samples of the window, and the second transition from 1, to 0, is determined from the third and fifth samples as well as the fourth and fifth samples of the window. In next consecutive window W2, the positive pulse can not be detected, but since the pulse already has been detected by the first window W1 this is of no importance. Here, since redundant samples are included in the sliding sample window, the general condition for confirming validity is based on an ensemble of consecutive windows. Validity is generally confirmed as long as at least one window of the ensemble of consecutive windows includes a valid transition sequence. The number of windows in the considered ensemble of windows is at least partly dependent on the level of sample redundancy. The next valid transition sequence is the connected negative pulse, and this transition sequence is captured by the third consecutive window W3 as well as the fourth window W4. By using the transition conditions given in expression (2) above to capture the transition sequences of the monitored signal, metastability situations are effectively handled.

Higher order extensions are realized by introducing additional redundant samples in the window and comparing samples separated by more than one sample. Naturally, there is a trade-off between reliability and complexity in this respect.

It is apparent that metastability correction requires a greater number M of samples within the sliding window compared to a monitoring mechanism without any correction capabilities. It may thus seem necessary to increase the frequency of the sample clock in order to squeeze a further number of samples into a sliding window that is adapted for a given pulse width. For high-frequency applications this would be a severe limitation. However, the invention substantially reduces this problem by a multi-phase sampling technique, which will be described in detail below with reference to a preferred embodiment of the invention.

As a general principle, and more particularly in order to reduce the need for oversampling in high-frequency applications, the invention proposes a multi-phase sampling technique according to which a set of N phase-shifted sample clocks $S_1$, to $S_N$, of the same frequency are generated for the purpose of sampling the signal to be monitored. There are various ways of generating the phase-shifted clock signals, for example by delaying a master clock using a number of delay elements in a conventional manner, or from division and decoding of a higher clock rate if such is available. In the former case, oversampling with a much higher sample clock frequency compared to the supervised signal is replaced by resolution in the time domain, imposing harsh requirements on phase accuracy. In the latter case, however, the problems of oversampling still remain.

In the following, the invention will be described with reference to a particular implementation adapted for pulse width detection of a clock signal.

Figure 4:
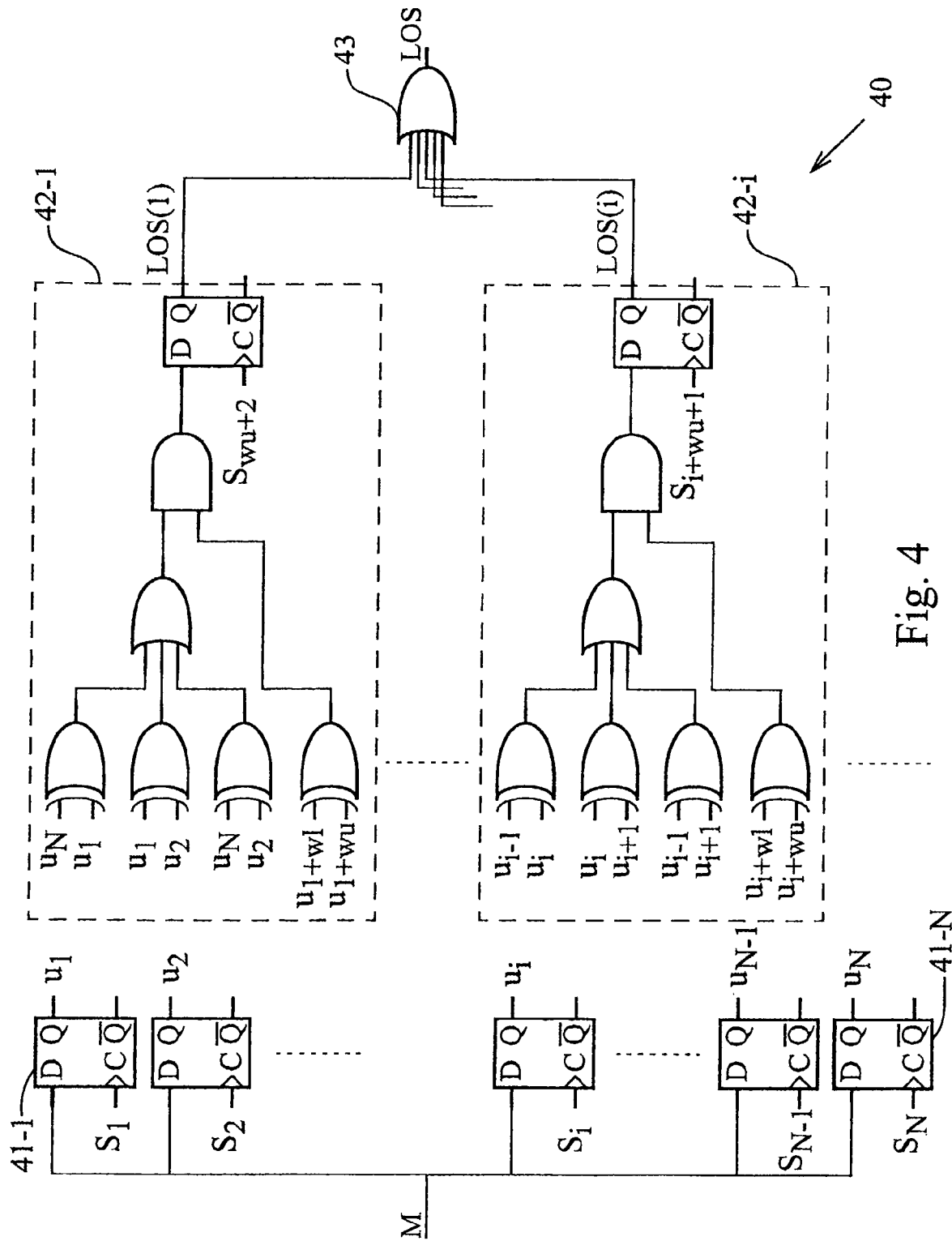
FIG. 4 is a circuit diagram of a signal monitor/loss detector according to a preferred embodiment of the invention.

FIG. 4 is a circuit diagram of a signal monitor/loss detector according to a preferred embodiment of the invention. The signal monitor 40 is implemented as a parallelized hardware structure, which comprises a number of edge-triggered memory elements such as digital flip-flop registers 41-1 to 41-N, one for each individual sample clock, a corresponding number of sub monitors 42-1 to 42-N (out of which only two are illustrated) for generating individual validity indications LOS(1) to LOS(N), and a logic element 43 for forming a compound alarm signal (LOS) from all the individual validity indications.

Figure 5A:
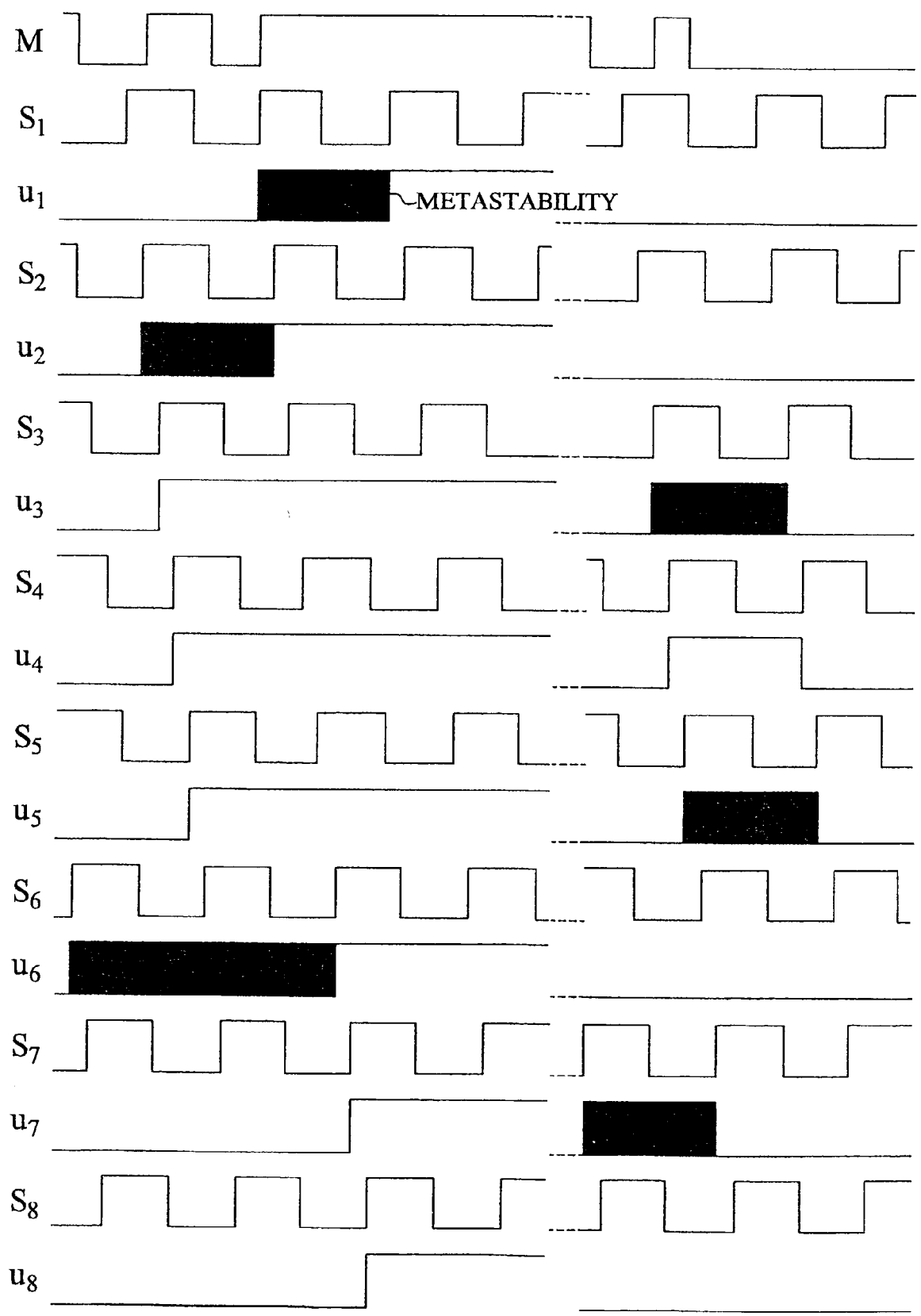
FIG. 5A is a schematic timing diagram illustrating an example of a monitored signal, sample clocks $S_1$ to $S_N$, and sample values $u_1$ to $u_N$, for the case of N=8.

During a sample cycle, each phase-shifted sample clock $S_i$, samples the monitored signal M as a data signal into a respective digital flip-flop register 41 to generate a corresponding sample value $u_i$. See also the timing diagram of FIG. 5A which illustrates an example of a monitored signal M, sample clocks $S_1$, to SN and sample values u1 to UN for the case of N=8. The example of FIG. 5A illustrates an initialization period, a stuck high fault and a subsequent stuck low fault.

Figure 5B:
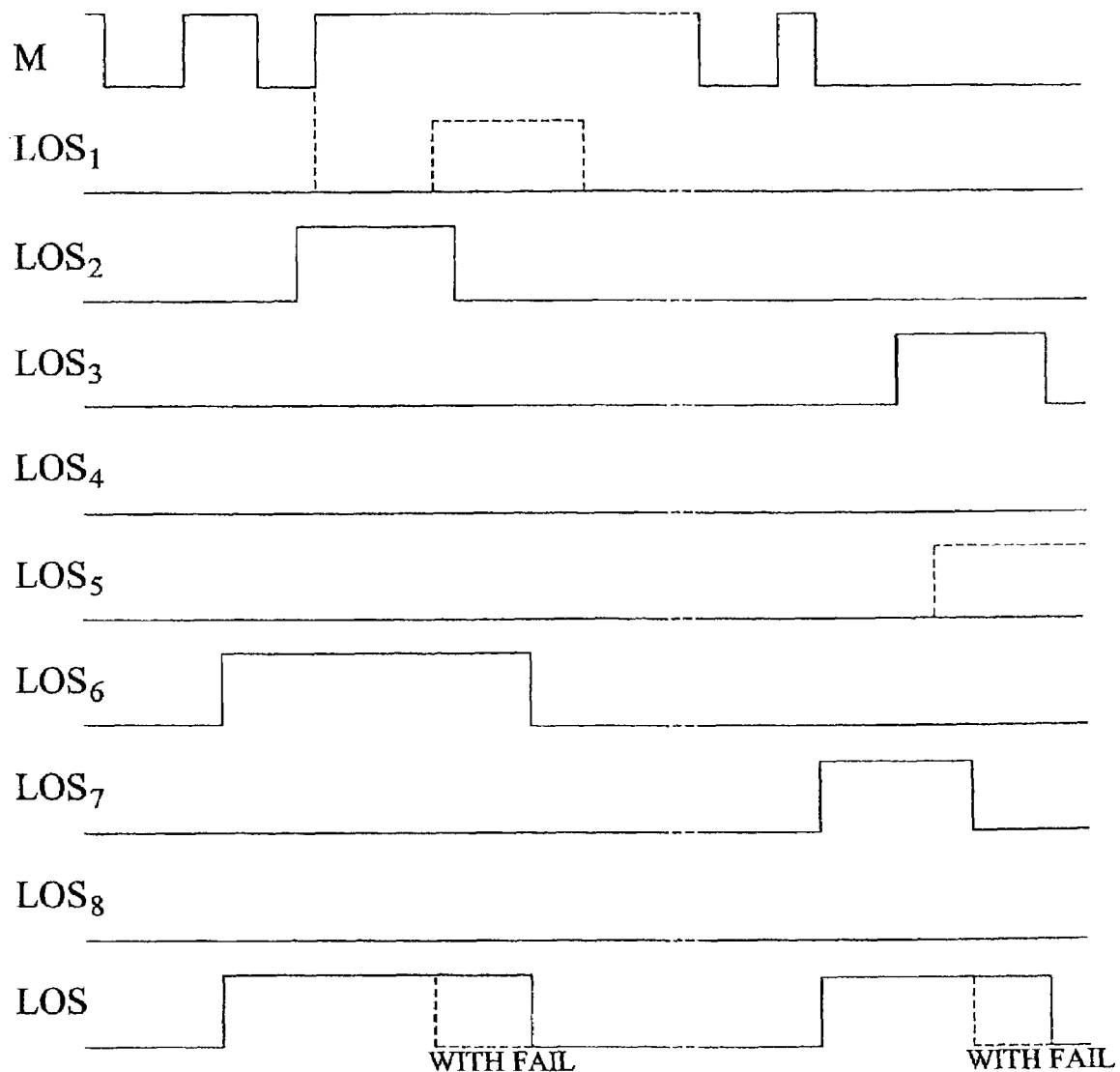
FIG. 5B is a timing diagram illustrating an example of individual indications LOS(i) and the compound alarm signal LOS for the monitored signal and the sample clocks of FIG. 5A.

The sample values u1 to UN of the registers 41-1 to 41-N are fed to the sub monitors 42-1 to 42-N in the manner illustrated in FIG. 4, and processed therein. Basically, the logic circuitry in each sub monitor implements a search procedure to determine whether a sample window associated with the corresponding sample phase includes a valid transition sequence or not. In this case, a valid transition sequence is found if a primary transition and an expected secondary reverse transition in a position consistent with the expected pulse/pause width of the monitored clock signal are found. If such a valid sequence is found, a corresponding individual validity indication LOS(i) is set high. The main LOS alarm is a compound alarm formed of all the individual indications. See also the timing diagram of FIG. 5B, which illustrates an example of individual indications LOS(i) and the compound alarm signal LOS for the monitored signal M and the sample clocks $S_1$, to $S_8$, shown in FIG. 5A. The compound LOS signal is active low. The LOS signal is high and inactive as long as at least one individual LOS(i) signal is high. Normally the LOS signal goes low only when all individual LOS(i) signals are low, due to an abnormal behavior of the monitored signal.

To describe the sampled clock signal M correctly, a complete set of phases with reasonable distribution over the sample clock period Ts must be present. Ideally, the sample clocks $S_1$, to $S_N$, are equally spaced, $\Delta\phi=\phi_i-\phi_j=2\pi/N$ if i<>j, with phases $\phi_1$, to $\phi_N$ that in a sample period $T_S$, fill a window suited for a selected transition sequence of the monitored signal. In essence, the phase-shifted sample clocks form a complete base vector system to describe the monitored signal M in the discrete sample clock time domain, as illustrated in the timing diagram of FIG. 5A.

The phase resolution or spacing $\Delta\phi$ (or $\Delta T_S$, in the time domain) with associated tolerances will ultimately determine how narrow clock pulses $\delta T_M$, (or pauses $[1-\delta]T_M$) that may be detected depending on the set-up ($t_{SU}$) and hold ($t_H$) requirements on the registers used to sample the monitored signal. The duty cycle of the monitored clock signal is assumed to vary in the span $\delta_M<\delta<1-\delta_M$. The following definitions and requirements are made:

$$t_S=\sup(t_{SU}, t_H)$$

$$\Delta\phi=\phi_i-\phi_{i+1} \forall i\in\{1,\ldots,N\}$$

$$\Delta T_S=\Delta\phi/(2\pi)\cdot T_S$$

$$\min(\Delta T_S)>2t_S$$

$$\max(\Delta T_S)<\delta_M T_M+2t_S,$$

where $\min(\Delta T_S)$ and $\max(\Delta T_S)$ are determined with consideration to the associated tolerances. Rigorous conditions on the sample phase spacing ($\Delta\phi_{min}$) ensure that two consecutive sample clocks are mutually delayed (phase shifted) more than the register set up and hold times.

A sample period wide enough to fit the longest pulse is defined by:

$$T_S>(1-\delta_M)T_M+2t_S$$

Identification of a transition in the monitored clock state (an edge) is basically accomplished by observation of a corresponding logic level shift in the sample representation $u_1, \ldots u_N$, between registers 41 with adjacent sample clock phases using a simple XOR gate which has a non-zero output only if the inputs are not equal. As already mentioned earlier, between any two arbitrary sample points (i, i+1), a sufficient transition condition is found to be:

$$u_i \oplus u_{i+1}=1 \forall i\in\{1,\ldots,N\}$$

where ⊕ denotes an XOR operation.

Cyclic conditions imposed on the phase-shifted clocks can be expressed as:

$$u_{N+1}=u_{10}$$

Obviously this is the case in a causal system with a full set of non-overlapped sample phases covering the entire sample period Ts so that a new sample period is initiated seamlessly with the update of the last register 41-N. For a specific sample event or point (i) associated with a positive edge of sample clock S1 the detection of a primary clock transition (TR1) in the vicinity preferably involves preceding and successive sample phases:

$$TR1(i)=u_i \oplus u_{i-1}+u_i \oplus u_{i+1}$$

where the plus sign denotes an OR operation.

In case of a metastability condition occurring in the register 41-i, currently updated, other registers in the close proximity are normally unaffected and contain correct data. Preferably, redundant logic terms, $u_{i-1} \oplus u_{i+1}$, involving additional sample points are used to resolve possible metastability issues and secure any transition occurring in the vicinity of a clock phase $S_i$.

As mentioned earlier, higher order extensions comparing register contents separated more than one sample phase introduce a larger degree of fault coverage at the expense of an increased logic depth involving more sample phases in each of the N equal decision intervals that add up to the overall alarm. It should be noted that additional correction elements lower the impact of metastability duration over many sample cycles which can prove troublesome if too many registers are affected at the same time together with a rotating phase relationship between the asynchronous sample and monitored clocks. Increased fault tolerance also requires a refined phase spacing to fit in the detection window (W).

In the implementation of FIG. 4, the search for a primary transition around sample phase i with first order error correction is defined by:

$$TR1(i)=u_i \oplus u_{i-1}+u_i \oplus u_{i+1}+u_{i-1} \oplus u_{i+1}$$

where ⊕ denotes an XOR operation, and the plus sign denotes an OR operation. In each sub monitor 42, the primary transition search defined above is realized by three XOR gates followed by an OR gate.

The expected secondary transition (TR2) must occur inside a secondary transition subwindow defined by the lower limit wl and the upper limit wu offseted from the sample point under investigation to ensure that the secondary transition is found in a position consistent with the pulse/pause width of the monitored signal:

$$TR2(i)=u_{i+wl} \oplus u_{i+wu}$$

This is realized by a further XOR gate. Preferably, the secondary transition window [wl, wu] is wide enough to accommodate clock frequency and duty cycle deviations. Only valid transitions are of interest and since the detection window is wide enough to cope with all variations there is generally no need for any additional error correction efforts. Depending on the level r of redundant sample information from previous sample points (i-1, i-2, ..., i-r) that is required, the following holds true:

$$wu+r+1 \leq N$$

$$1 \leq wl \leq wu-1$$

For each sample phase, the two transition expressions TR1(i) and TR2(i) are combined by an AND operation, realized by the AND gate in the corresponding submonitor 42, to generate an individual validity indication LOS(i):

$$LOS(i)=TR1(i) \cdot TR2(i),$$

where · denotes an AND operation.

Further refinement allows a separation of the two transitions high to low and low to high which enable detection of harmonic frequencies. More than one up (TRU) or down (TRD) transition in a row is then illegal. Error correction is not incorporated in the example below:

$$LOS(i)=TRU1(i) \cdot TRD2(i)+TRD1(i) \cdot TRU2(i)$$

$$TRU1(i)=u_i \cdot \overline{u_{i-1}}+\overline{u_i} \cdot u_{i+1}$$

$$TRD1(i)=\overline{u_i} \cdot u_{i-1}+u_i \cdot \overline{u_{i+1}}$$

$$TRU2(i)=\overline{u_{i+wl}} \cdot u_{i+wu}$$

$$TRD2(i)=u_{i+wl} \cdot \overline{u_{i+wu}},$$

where $\overline{u}$ denotes a logic inversion of u. In the implementation of FIG. 4, the LOS signal is an alarm that is active low. The compound alarm signal LOS is formed as a super-position of all individual indications from the different intervals around each sample phase ($S_i$), and at least one interval, or sample window, must include a valid transition sequence in order to confirm the existence of a valid clock signal. This is realized by the OR gate 43 in the monitor 40 of FIG. 4:

$$LOS=LOS(1)+LOS(2)+ \ldots +LOS(N),$$

where the plus sign denotes an OR operation.

To summarize the hardware implementation of FIG. 4 this far, the clock monitoring according to the above preferred embodiment involves a basic search procedure that is defined by TR1(i)·TR2(i) and confined in an individual sample window $SW_i$. Simplified, this basic search procedure is repeatedly exercised in a cyclic/pipelined manner for all sample phases ($\phi_i/S_i$), in effect realizing a sliding window procedure.

Figure 6:
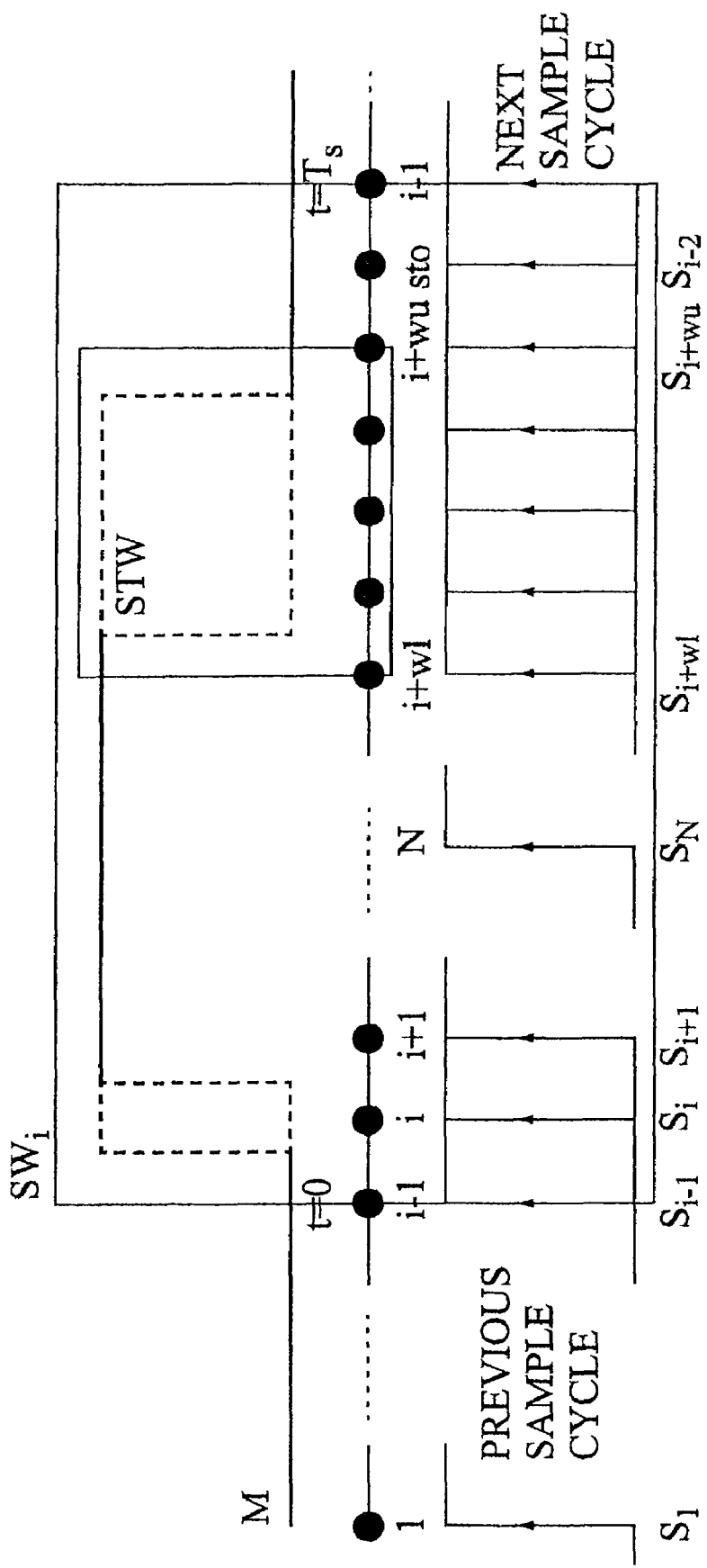
FIG. 6 is a schematic timing and sample point diagram illustrating the sample window formed for a given sample phase $\phi_i$, including a subwindow for an expected secondary transition.

FIG. 6 is a schematic timing and sample point diagram illustrating the sample window formed for a given sample phase $\phi_i$, including a subwindow for an expected secondary transition. For each sample phase $\phi_i$, a sample window $SW_i$, is spanned up starting from the corresponding sample point i or the preceding sample point i-1, depending on the particular realization of the primary transition expression TR1(i), and extending substantially a whole sample period $T_S$. In each sample window $SW_i$, a possible primary transition is monitored at the beginning of the sample window, and if found, a subsequent subwindow STW [i+wl, i+wu] is formed for the expected secondary transition. The sample information (associated registers) for a given sample window SW, is updated only once during a sample cycle triggered by positive (or negative) transitions in the sample clocks that form part of the particular sample window. Causality is preserved if the result of both edge detection and time out check for the secondary transition is processed and stored in a register only once in a sample cycle, at the first consecutive clock phase (sto) outside each respective secondary expected transition window (STW). For this purpose, each sub monitor 42 (see FIG. 4) has a register (DFF) for regularly storing/updating the individual validity indication LOS(i). No registers must be reloaded with new information before the store cycle is finished, requiring that the whole search process must fit into a single sample period. Please note the wrap around behavior from phase φN associated with sample clock $S_N$, to phase $φ_1$, associated with sample clock $S_1$.

In essence the clock supervision is managed by a divide and conquer technique that allows the problem to be discretisized in the time domain using a number of phase-shifted sample clocks to form overlapping subintervals, here referred to as sample windows (SW), one sample window around each sample point (see FIG. 6). Each sample phase together with the necessary phases in the associated sample detection window are scanned with a distributed algorithm which is replicated for all other sample phases, forming a set of N overlapping sample windows (SW). In general, at least one of the sample windows must include a valid transition sequence during a sample clock cycle ($T_S$) or else the monitored clock is disqualified.

It is apparent that each individual sample window ($SW_i$) within a sample cycle ($T_s$) is associated with an individual sub monitoring mechanism, which determines whether the samples within the sample window ($SW_i$) include a valid transition sequence. For optimized performance, these sub monitoring mechanisms are arranged for parallel as well pipelined operation. In the example of FIG. 4, the parallelism originates from the hardware structure of the overall monitor 40, and the pipelined operation, which is an inherent feature of the sliding-window based search procedure, is manifested by the phase-shifted sample clocks.

Figure 7:
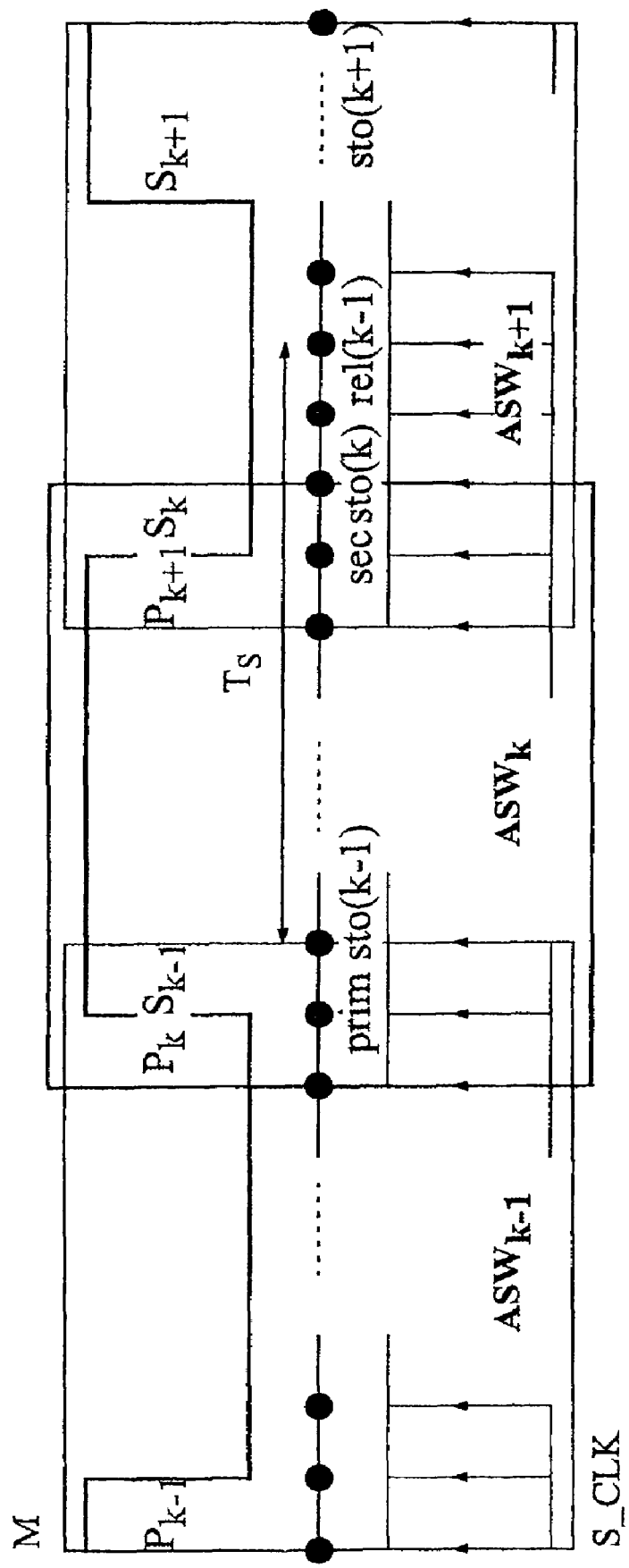
FIG. 7 is a schematic timing and sample point diagram illustrating a continuous stream of primary and secondary transitions triggering a chain of overlapping so-called adaptive sample windows.

FIG. 7 is a schematic timing and sample point diagram illustrating a continuous stream of primary and secondary transitions triggering a chain of overlapping so-called adaptive sample windows. If a primary transition ($P_k$) is actually detected in a sample window and an opposite transition ($S_k$) occurs in the associated secondary transition window the alarm indication LOS(k) is valid for one sample clock period (until rel) and an adaptive sample window ($ASW_k$) is formed spanning from the primary transition to the store pulse (sto). The secondary transition ($S_k$) in this window becomes a primary transition ($P_{k+1}$) in the next connected and overlapping adaptive sample window ($ASW_{k+1}$) originating from the same (synchronous sample and monitored clocks) or another (asynchronous) individual sample window in the next sample cycle. Compared to prior art techniques, the alarm management according to the invention is reversed so that the monitored clock must prove its existence (in some subinterval within a sample cycle) to avoid a clock loss indication.

To fully exploit the performance potential of the monitor/loss detector a fail state is introduced in relation to each individual sample window indicating FAIL when a primary transition is not followed by a secondary transition within the stipulated secondary transition window. As explained above, a valid transition sequence in a sample window clears the alarm for substantially one sample clock period ($T_S$). Since the adaptive sample windows overlap, a high loss indication signal (no alarm) generated by the last valid secondary transition is released (rel) some time after a failed transition sequence is detected. Thus the alarm is delayed unnecessarily long. True pulse width detection within the current adaptive window is realized if the loss detection signal also takes into account that no fail states are allowed at any window edge in a manner similar to the loss generation described earlier.

Figure 8:
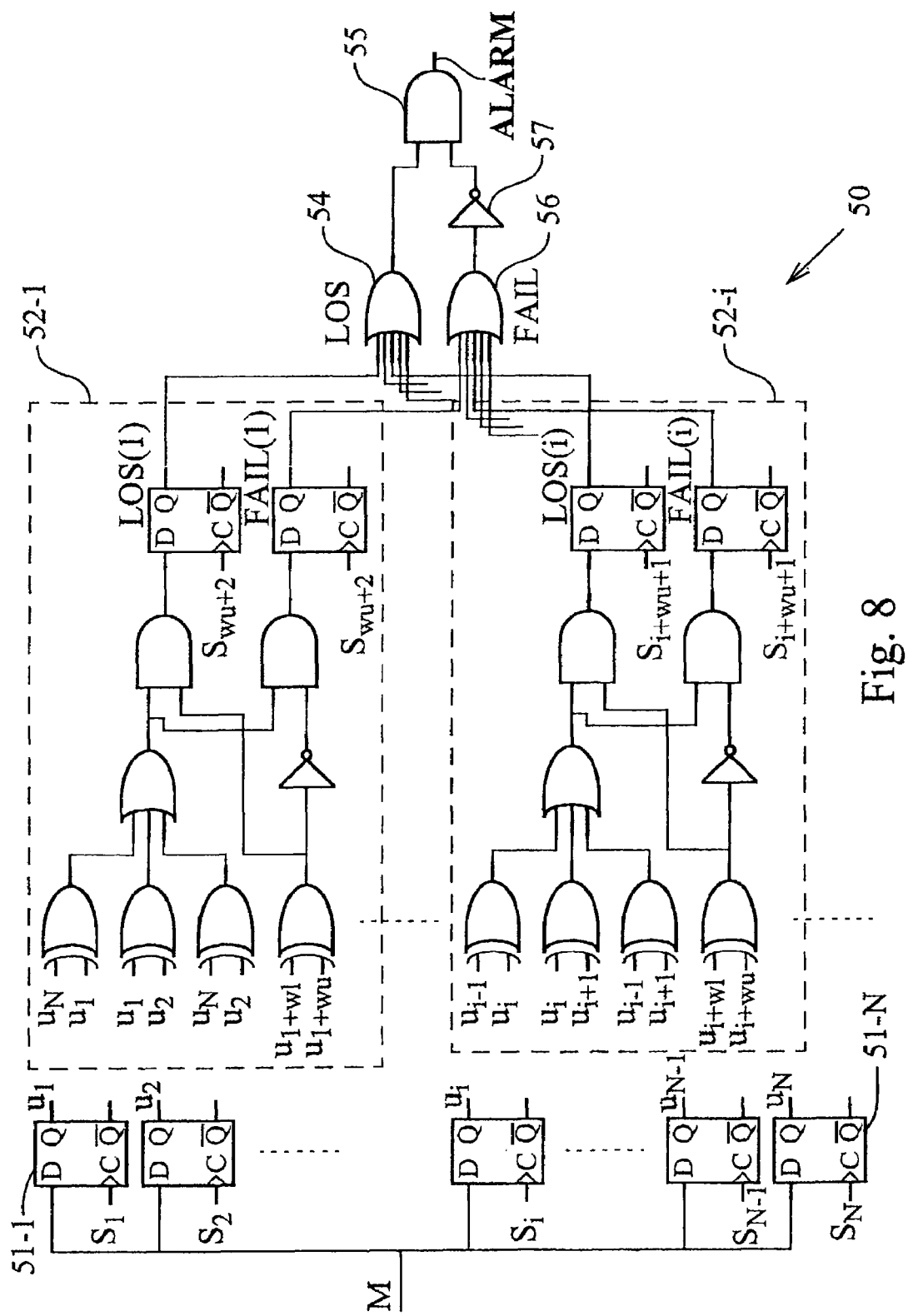
FIG. 8 is a schematic circuit diagram of a signal monitor/loss detector similar to that of FIG. 4, except for a time out mechanism when a primary transition is detected but no secondary transition occur.

FIG. 8 is a schematic circuit diagram of a signal monitor/loss detector similar to that of FIG. 4, except for a time-out mechanism when a primary transition is detected but no secondary transition occur. In similarity to the monitor 40 of FIG. 4, the monitor 50 of FIG. 8 comprises a number of edge-triggered memory elements 51-1 to 51-N and a number of sub monitors 52-1 to 52-N (out of which only two are illustrated).

In this realization, however, at least one valid and no failed transition sequences are required at each instant to give an alarm free output (logic high). For this reason, each sub monitor 52 is adapted to generate an individual LOS(i) signal as well as an individual fail signal FAIL(i). Each individual fail signal FAIL(i) is formed in a similar manner as the individual LOS(i) signal, with the exception of an inverter arranged in the path from the secondary transition checking XOR gate to a further AND gate, which generates the individual fail signal. The main alarm signal ALARM is obtained from an AND gate 55 summing the compound LOS signal from the OR gate 54 and the compound FAIL signal from the inverter 57 following the OR gate 56. The compound FAIL signal is formed from all individual fail indications FAIL(i). Reference is also made to FIGS. 5A-B again, where the improvement in detection time for the resulting alarm signal ALARM (LOS in FIG. 5B) for a fail state loss detector is indicated by dotted lines.

Figure 9:
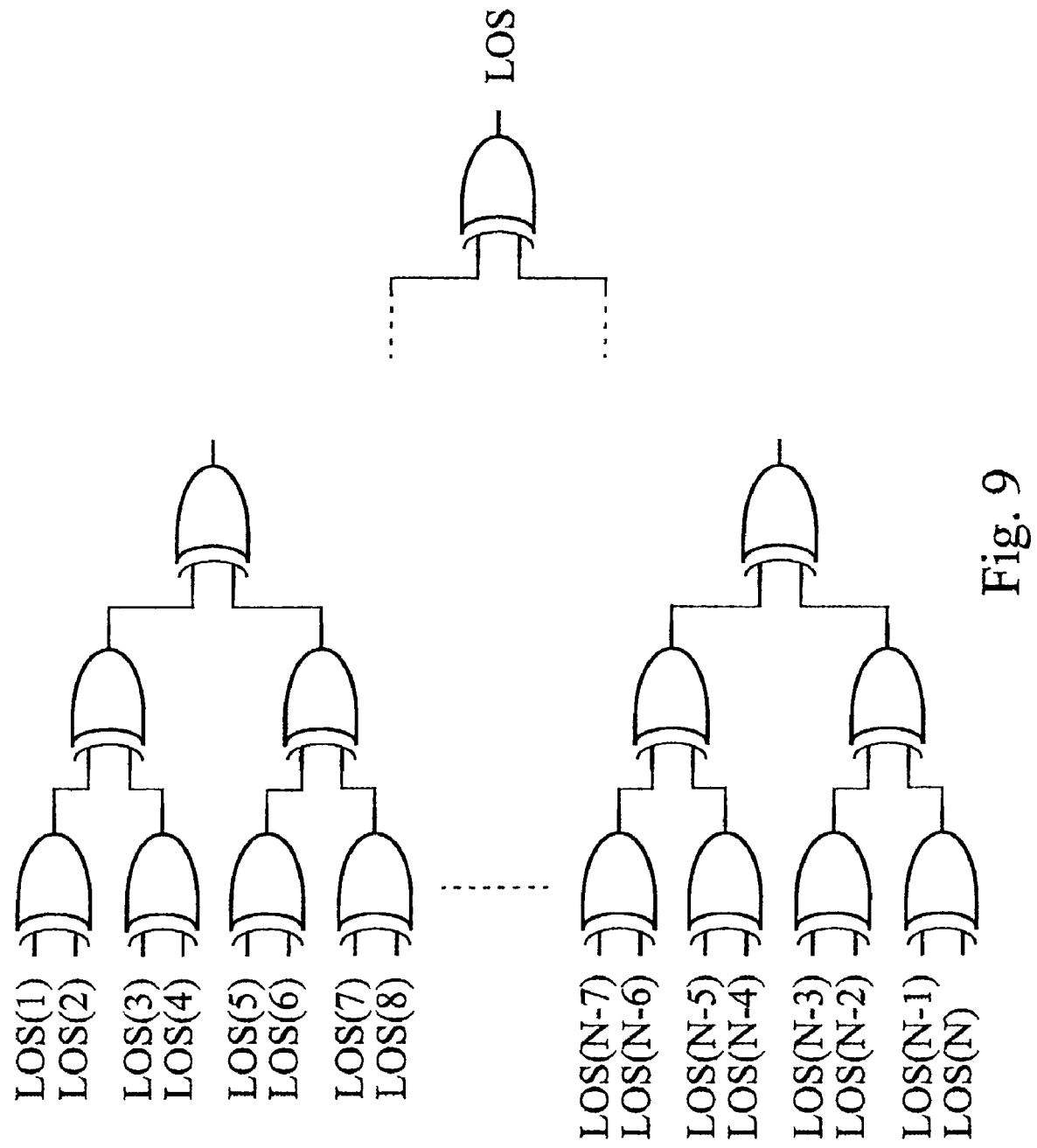
FIG. 9 is a schematic diagram of a glitch detection mechanism that can be incorporated into the loss detectors of the invention.

FIG. 9 is a schematic diagram of a glitch detection mechanism that can be incorporated into the loss detectors of the invention. Glitch detection covering anomalous clock behavior other than pure clock loss requires a more sophisticated decision algorithm. Exactly one valid transition sequence is allowed in a complete sample cycle ($T_S$) including the contribution from all individual sample windows. According to a preferred embodiment, glitch detection is accomplished by means of a branched off tree topology made up by successive XOR comparison of two values at each level. Such a topology will ensure that only one individual LOS signal at a time can inhibit the overall loss alarm.

If no oversampling is used, the sample and monitored clock periods must be roughly of the same order of magnitude (but still coping with the pulse width variations), thus involving two sets of transition sequences in each sample cycle. For the glitch sensitive detector the pass condition is now exactly two transition sequences in each sample period still maintaining an adaptive detection window with bit-width reaction time.

Ultimately, in a specialized and refined embodiment there exists no need for a separate set of sample clocks. Instead, the phase-shifted sample clocks are created or synthesized directly from the monitored clock. In a synchronous system based on normal edge-triggered memory elements such as DFFs it seems impossible to supervise a clock signal and form an infinite hold alarm signal using no other means than the clock it self which by the very nature of the supervision problem disappears unexpectedly (high or low, etc.). Some what similar to the mathematical autocorrelation entity for a stationary signal, which in this case yields a well behaved clock signal without glitches, the introduction of delay elements enables processing of the current input signal or monitored clock using prior timing (transitions). Cascaded explicit or in logic networks implicitly formed delay units ($\Delta T_1, \ldots, \Delta T_n$) provide a means to create a set of n phase-shifted or delayed clocks, further on denoted $M_1, M_2, \ldots, M_n$, more or less directly from the monitored clock signal M itself. Preferably, the basic self-monitoring detector topology is adapted to reduce the complexity and thus fully benefit of all the additional information gained from the specific synchronous sample clock generation algorithm that will be explained below.

Figure 10:
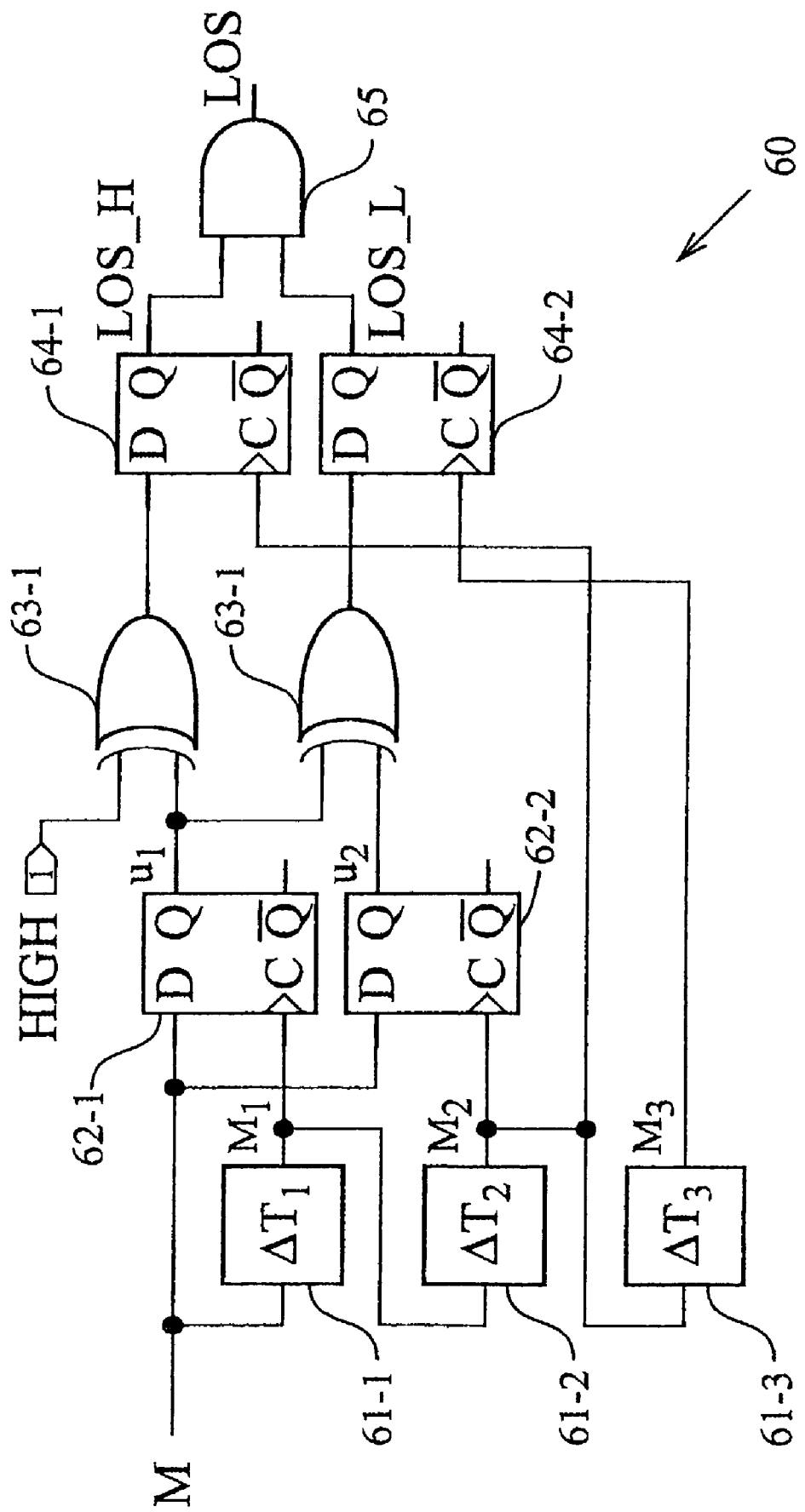
FIG. 10 is a schematic circuit diagram of a basic self monitoring clock loss detector according to a preferred embodiment of the invention, illustrated for the case of n=3.

FIG. 10 is a schematic circuit diagram of a basic self monitoring clock loss detector according to a preferred embodiment of the invention, illustrated for the case of n=3. The self monitoring loss detector 60 basically includes a number cascaded delay elements 61-1 to 61-3 for forming a corresponding number of delayed clocks $M_1$, to $M_3$, two registers 62-1 and 62-2, two XOR gates 63-1 and 63-2 and two additional registers 64-1 and 64-2 for storing/updating individual LOS_, H and LOS_, L signals as well as a logic element 65 for forming a compound LOS signal.

Designing a signal supervision circuit without any other means than the signal itself, i.e. excluding an independent sample clock, gives rise to a particular problem if the detector must react and alter state within one signal period, i.e. pulse width detection speed. A new concept slightly different than the parallel processing previously used in the main algorithm is introduced to address this problem. Now, each sample window is partitioned into a series of connected, or slightly overlapping, subwindows (PSW). Each subwindow is updated only once in a sample period but the cascaded structure enables much faster detection. Most important is the ability to achieve pulse width detection speed even in a period based detector without reverting to oversampling.

Figure 11:
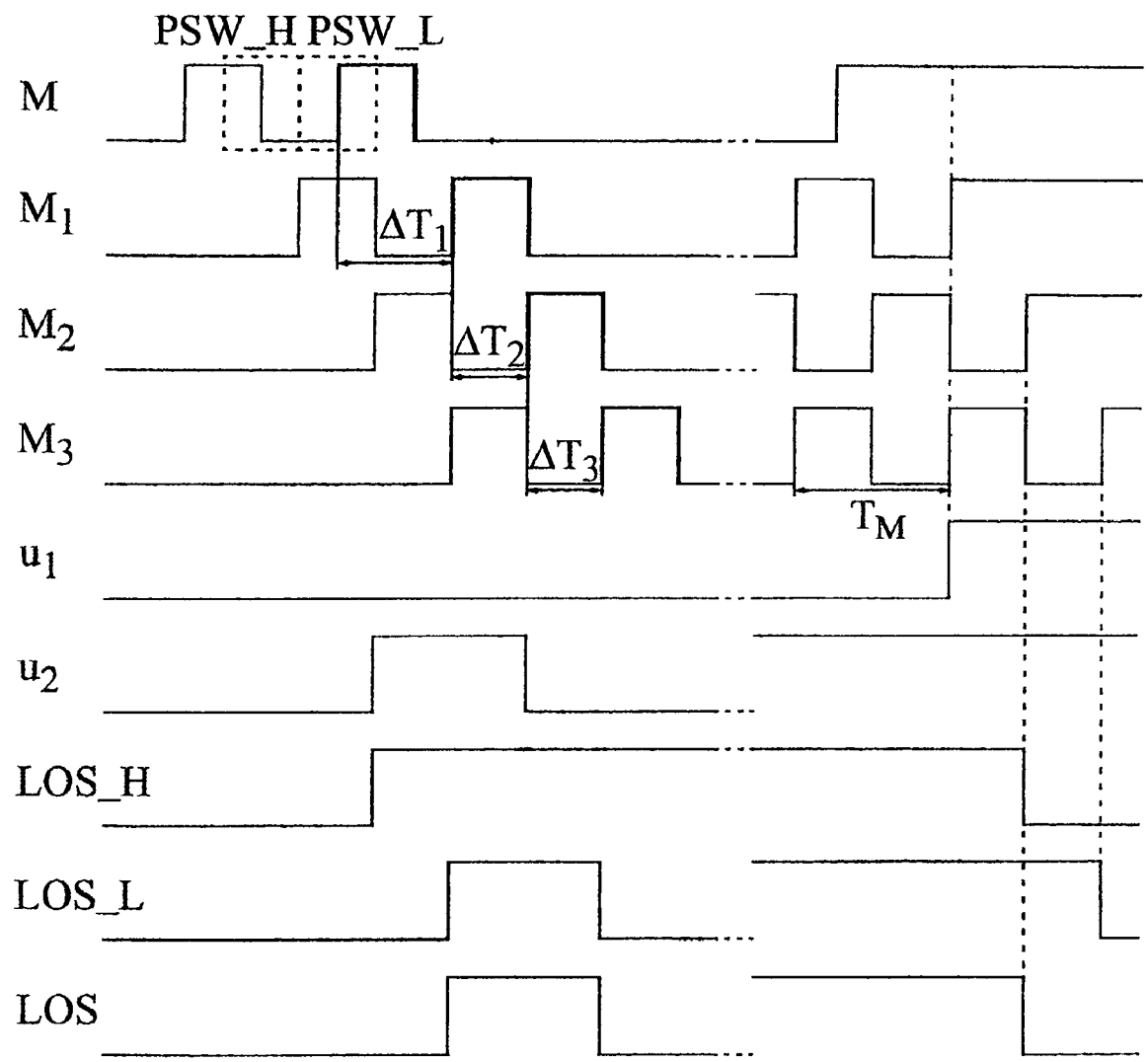
FIG. 11 is a timing diagram for a loss detector using sample phases extracted from the monitored clock with two connected, possibly slightly overlapping, pulse width subwindows.

For a better understanding of the self-monitoring concept, reference is also made to FIG. 11 which is a timing diagram for a loss detector using sample phases extracted from the monitored clock with two connected, possibly slightly overlapping, pulse width subwindows. At first the monitored clock M appears and the loss detector requires roughly one additional sample period to release the alarm signal so as to initiate the self-monitoring. Two error situations are depicted, namely when the monitored clock is stuck low and high.

In each sample cycle, a specific valid transition must appear in each of the partitioned subwindows, PSW_, H and PSW_, L. Each sample cycle is initiated by a positive transition of the monitored clock M. All delay and phase relations are referenced to a zero time and phase plane associated with this triggering initial transition. Particularly, it is important to understand that state information, hard coded HIGH, is obtained based on this implicit initial transition, and utilized in assessing whether the first subwindow, PSW_, H, includes a valid transition or not. This is possible since the monitored clock always exhibit a positive transition at least one period prior to the clock loss. This also eliminates the first sample phase otherwise needed in the main algorithm, and is realized by hard coding one of the inputs to the first XOR gate 63-1 HIGH. Without any error correction in a rudimentary implementation of the lowest order, the valid transition conditions for the partitioned subwindows are:

$1 \oplus u_1 = 1$, (PSW_H)

$u_1 \oplus u_2 = 1$, (PSW_L)

Two associated independent loss detection indications are generated as follows:

$LOS\_H = 1 \oplus u_1$ $LOS\_L = u_1 \oplus u_2$ and stored in the associated registers 64-1 and 64-2 in response to M2 and M3, respectively. More specifically, the transitions of the second (synergism with the sample function) and third sample clocks act as store pulses to update the two loss detection signals, LOS_, H and LOS_, L, outside of the respective transition windows.

According to the partitioning algorithm used here, both LOS_, H and LOS_, L must include a valid transition, which gives the compound loss detection signal LOS in the following way:

$LOS = LOS\_H \cdot LOS\_L =, (1 \oplus u1) \cdot (u1 \oplus u2)$

Delay accuracy and monitored signal variations due to duty cycle irregularities and timing jitter must be carefully considered.

Although not necessary in the simplest implementation of the self-monitoring loss detector, the previously described techniques for providing flexible error correction can also be applied in self-monitoring applications.

In depth exploitation of the subwindow partitioning technique proposed above, increases the flexibility also for the main algorithm and introduces a new degree of freedom making the concept more general and easy to adapt to a wider range of supervision problems with less restrictions. The basic structure of the detectors shown in FIGS. 4 and 8 does not need any substantial modifications. Particularly, the fundamental divide and conquer idea found in the formation of a set of parallel sample windows and the phase-shifted sample clocks together with the simple combinatorial alarm generation found at both micro and macro level can be preserved. In general, each sample window (SW1, . . . , SWn) in a sample cycle may be partitioned or sliced up into a series of partitioned subwindows (PSWi1, PSWi2, . . . , PSWim i=1, . . . n):

$$\begin{bmatrix} PSW_{11} & \ldots & PSW_{1m} \\ \ldots & \ldots & \ldots \\ PSW_{n1} & \ldots & PSW_{nm} \end{bmatrix}$$

Figure 12:
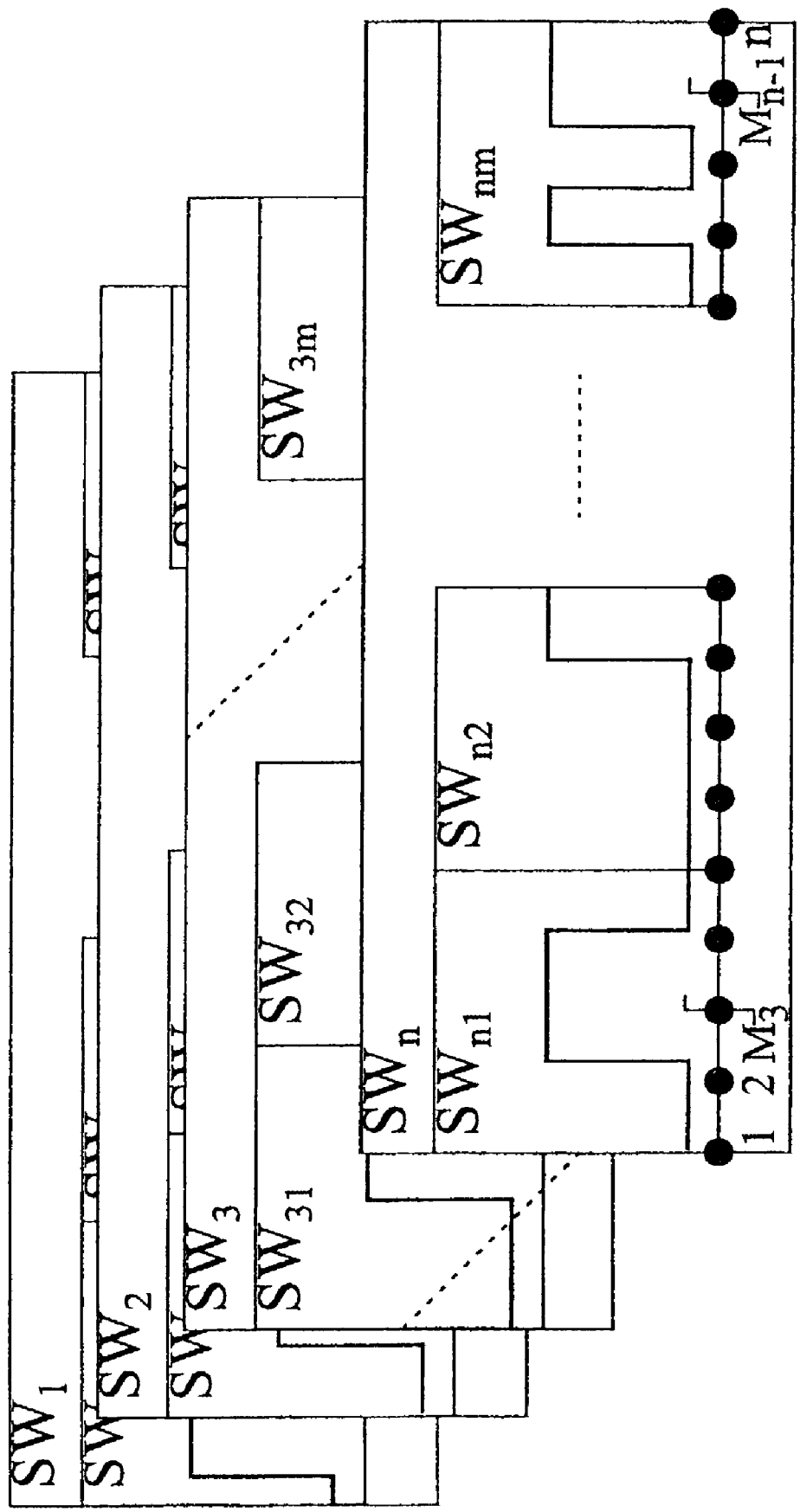
FIG. 12 is a schematic diagram illustrating the basic partitioned sample window hierarchy together with the underlying time discrete sample point basis.

FIG. 12 is a schematic diagram illustrating the basic partitioned sample window hierarchy together with the underlying time discrete sample point basis. In each partitioned subwindow, a specific transition, or alternatively a valid transition sequence, is defined and compared to observed transitions. A valid transition or transition sequence must occur in each subwindow related to a particular sample window to grant a positive individual LOS(i) signal:

$LOS(i) = LOS(PSWi1) \cdot LOS(PSWi2) \cdot \ldots \cdot LOS(PSWin)$

In the same manner as described above, the compound LOS signal is normally formed as a superposition of all individual LOS(i) signals.

Extending the scope to cover a broader range of signals other than pure stationary and cyclic clock signals merely requires a slight alteration of the described detector implementations. For example, various line codes and other means of narrowing the signal frequency spectrum ensure a high transition density as well as a defined limit for the longest sequence of data bits with the same polarity given a fundamental bit rate (width). The sample clock phase separation must be chosen narrow enough such that a single data bit is reliably detected analogous to the previous analysis. The overall detection window must be wide enough to cope with the longest pulse, here apparent as the longest constant bit sequence without a data transition. Since data signals are aperiodic there is no way to predict a transition and thus a partitioning of the (sample) detection window into an equivalent set of bit width detection windows is preferred and the most reliable solution. In contrary to the partitioning method described in conjunction with the self monitoring detector, a valid transition/transition sequence must appear in at least one of the connected subwindows (PSW) formed by the partitioning process. Here, single or multiple data transitions do not make any difference; simply substitute the AND condition with an OR condition.

Even in a single sample window without any partitioning, it is still feasible to implement a general signal supervision circuitry if several additional transition conditions and error correction supplements are introduced within the larger window to cope with all possible transition sequences.

The embodiments described above are merely given as examples, and it should be understood that the present invention is not limited thereto. Further modifications, changes and improvements which retain the basic underlying principles disclosed and claimed herein are within the scope and spirit of the invention.

What is claimed is:

1. A method of monitoring a sampled signal, the method comprising the steps of:
    sliding a window of M samples, where M is an integer equal to or greater than 3, over said sampled signal and wherein said sampled signal is obtained by sampling a signal by means of N phase-shifted sample clocks of the same frequency, where N is an integer equal to or greater than M so that said window fits within a single sample clock cycle;
    determining whether the samples currently in said window include a valid transition sequence; and
    confirming the validity of said signal as long as said valid transition sequence is present in at least one of a predetermined number of consecutive windows.

2. The monitoring method according to claim 1, wherein each one of said predetermined number of consecutive windows is associated with an individual sub monitoring mechanism for determining whether the samples within the current window include a valid transition sequence, said sub monitoring mechanisms being arranged for parallel as well pipelined operation.

3. The monitoring method according to claim 1, wherein said valid transition sequence includes a first transition, and a later reverse transition in a position consistent with the expected pulse/pause width of said signal.

4. The monitoring method according to claim 3, wherein said determining step includes the steps of:
    searching for said first transition as a first change of logical levels between samples of said window; and
    searching for said later reverse transition as a reverse change of logical levels between later samples of said window that reside within a subwindow of samples that is consistent with the expected pulse/pause width of said signal.

5. The monitoring method according to claim 4, wherein said subwindow of samples is wide enough to accommodate frequency and duty cycle deviations to a predetermined degree.

6. The monitoring method according to claim 3, wherein the distance between consecutive samples in said window is smaller than the shortest of the pulse width and the pause width of said signal, and said window of M samples is longer than the pulse width or pause width of said signal.

7. The monitoring method according to claim 1, wherein said predetermined number of consecutive windows generally corresponds to the number M of sample forming said window 8. The monitoring method according to claim 1, wherein said valid transition sequence includes at least two transitions and said determining step includes the step of searching for each transition as a change of logical levels between samples of said window.

9. The monitoring method according to claim 8, wherein said step of searching for each transition as a change of logical levels between samples of said window includes comparison of adjacent samples as well as comparison of samples separated by one or more other samples, whereby improved error correction capability is obtained.

10. The monitoring method according to claim 1, wherein said method further comprises the steps of:
    indicating a valid transition sequence if such a sequence is found within the current window; and
    indicating signal failure if no valid transition sequence is indicated during said predetermined number of consecutive windows.

11. The monitoring method according to claim 1, wherein said sliding window is partitioned into a series of subwindows, and said step of determining whether the samples currently in said window include a valid transition sequence includes the steps of:
    determining, for each of said partitioned subwindows, whether the subwindow includes a valid transition or sub transition sequence, and
    concluding that the samples currently in said window include a valid transition sequence provided that at least one subwindow includes its corresponding valid transition or sub transition sequence 12. The monitoring method according to claim 1, wherein said monitored signal is a clock signal or a data signal, said data signal having a given bit width and a predetermined limit for the longest sequence of data bits of the same polarity.

13. The monitoring method according to claim 1, wherein the validity of said signal is confirmed as long as said valid transition sequence is present in each consecutive window.

14. The monitoring method according to claim 1, wherein one of said M samples in said window is an implicit sample.

15. A method of monitoring a clock signal, said method comprising the steps of:
    sampling said clock signal by a set of delayed clock signals formed from the monitored clock signal itself, each sample cycle being initiated by a transition, of a given polarity, of the monitored clock signal, and all delay and phase relations being referenced to a zero time and phase plane associated with said initial transition;
    sliding a window of samples over said sampled signal;
    determining whether the samples currently in said window together with an implicit sample extracted from the initial transition of the current sample cycle include a valid transition sequence; and
    confirming the validity of said signal as long as the samples of said window together with said implicit sample include said valid transition sequence.

16. A device for monitoring a sampled signal, said device comprising:
    means for sliding a window of M samples, where M is an integer equal to or greater than 3, over said sampled signal, wherein said sampled signal is obtained by circuitry for sampling a signal by N phase-shifted sample clocks of the same frequency, where N is equal to or greater than M so that said window fits within a single sample clock period;
    means for determining whether the samples currently in said window include a valid transition sequence; and
    means for confirming the validity of said signal as long as said valid transition sequence is present in at least one of a predetermined number of consecutive windows.

17. The monitoring device according to 16, wherein each one of said consecutive windows is associated with an individual sub monitoring mechanism for determining whether the samples within the current window include a valid transition sequence, said sub monitoring mechanisms being arranged for parallel as well as pipelined operation.

18. The monitoring device according to claim 16, wherein that said determining means operates on the basis that said valid transition sequence includes a first transition, and a later reverse transition in a position consistent with the expected pulse/pause width of said signal.

19. The monitoring device according to claim 18, wherein said determining means includes:
   means for searching for said first transition as a first change of logical levels between samples of said window; and
   means for searching for said later reverse transition as a reverse change of logical levels between later samples of said window that reside within a subwindow of samples that is consistent with the expected pulse/pause width of said signal.

20. The monitoring device according to claim 19, wherein said subwindow of samples is wide enough to accommodate frequency and duty cycle deviations to a predetermined degree.

21. The monitoring device according to claim 18, wherein said sliding window means operates on the basis that the distance between consecutive samples in said window is smaller than the shortest of the pulse width and the pause width of said signal and that said window of M samples is longer than the pulse width or pause width of said signal.

22. The monitoring device according to claim 16, wherein said predetermined number of consecutive windows generally corresponds to the number M of samples forming said window.

23. The monitoring device according to claim 16, wherein said valid transition sequence includes at least two transitions and said determining means includes means for searching for each transition as a change of logical levels between samples of said window.

24. The monitoring device according to claim 23, wherein said means for searching for each transition as a change of logical levels between samples of said window includes comparison of adjacent samples as well as comparison of samples separated by one or more other samples for detection of said change of logical levels, whereby improved error correction capability is obtained.

25. The monitoring device according to claim 16, wherein said sliding window means and said determining means are realized as a parallel monitoring structure comprising, for each individual sample clock, a sub monitor for determining whether the samples within a window associated with the individual sample clock includes a valid transition sequence and for selectively indicating a valid transition sequence during a predetermined time period.

26. The monitoring device according to claim 16, wherein said device further comprises:
   means for indicating a valid transition sequence if such a sequence is found within the current window; and
   means for indicating signal failure if no valid transition sequence has been indicated during said predetermined number of consecutive windows.

27. The monitoring device according to claim 16, wherein said sliding window is partitioned into a series of subwindows, and said means for determining whether the samples currently in said window include a valid transition sequence includes:
   means for determining, for each of said partitioned subwindows, whether the subwindow includes a valid transition or sub transition sequence; and
   means for concluding that the samples currently in said window include a valid transition sequence provided that at least one subwindow includes its corresponding valid transition or sub transition sequence.

28. The monitoring device according to claim 16, wherein said monitored signal is a clock signal or a data signal, said data signal having a given bit width and a predetermined limit for the longest sequence of data bits of the same polarity.

29. A device for monitoring a sampled signal, said device comprising:
   a parallelized monitoring structure for sliding a predetermined window over said sampled signal, said monitoring structure including a number of sub monitors, one for each of a predetermined number of consecutive windows formed by sliding a corresponding predetermined window over the sampled signal, each sub monitor having:
   means for determining whether the samples in the corresponding window include a valid transition sequence; and
   means for indicating a valid transition sequence during a predetermined time period provided such a sequence is found within the window;
   means for confirming the existence of a valid signal as long as at least one of said sub monitors indicates a valid transition sequence; and
   means for generating a plurality of phase-shifted sample clocks of the same frequency, said sampled signal being obtained by sampling a signal with said phase-shifted sample clocks;
   wherein the number of sub monitors corresponds to the number of consecutive windows formed by sliding a corresponding predetermined window over the sampled signal during a sample clock period.

30. device for monitoring a clock signal, the device comprising:
   means for sampling said clock signal by a set of delayed clock signals formed from the monitored clock signal itself, each sample cycle being initiated by a transition, of a given polarity, of the monitored clock signal, and all delay and phase relations being referenced to a zero time and phase plane associated with said initial transition;
   means for sliding a window of samples over said sampled signal;
   means for determining whether the samples currently in said window together with an implicit sample extracted from the initial transition of the current sample cycle include a valid transition sequence; and
   means for confirming the validity of said signal as long as the samples of said window together with said implicit sample include said valid transition sequence.

* * * * *